(12) United States Patent
Lee et al.

(10) Patent No.: US 6,291,271 B1
(45) Date of Patent: Sep. 18, 2001

(54) METHOD OF MAKING SEMICONDUCTOR CHIP PACKAGE

(75) Inventors: Chun-Chi Lee, Kaohsiung; Kao-Yu Hsu, Kaohsiung Hsien, both of (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/443,363

(22) Filed: Nov. 19, 1999

(51) Int. Cl.$^7$ ............... H01L 21/44; H01L 21/48; H01L 21/50

(52) U.S. Cl. ............ 438/121; 438/126; 438/613; 438/614

(58) Field of Search ............... 438/106, 121, 438/126, 613, 614

(56) References Cited

U.S. PATENT DOCUMENTS 5,402,006 * 3/1995 O'Donley.
5,872,051 * 2/1999 Fallon et al..
5,894,108   4/1999 Mostafazadeh et al..

OTHER PUBLICATIONS

"Adhesion Enhancement of Pd Plated Leadframes", by C.Q. Cui et al, ECTC 49th, 1999, Session 23.

R.O.C. Publication No. 348306 entitled "Device Having Resin Package and Method of Producing The Same".

* cited by examiner

*Primary Examiner*—Kevin M. Picardat
*Assistant Examiner*—D. M. Collins

(57) ABSTRACT

A method of making a semiconductor chip package utilizes a film carrier to support a semiconductor chip. The method comprises the steps of: forming a plurality of through-holes in a film carrier; laminating a metal layer on the film carrier; etching the metal layer to form a die pad and a plurality of connection pads disposed corresponding to the through-holes; forming a metal coating on the surfaces of the die pad and the connection pads which are not covered by the film carrier; attaching a semiconductor chip to the die pad; electrically coupling the semiconductor chip to the connection pads; forming a package body over the film carrier and the semiconductor chip; and removing the film carrier. Since the method of making a chip package in accordance with the present invention utilizes a low cost film carrier to support the chip during the assembly process and the film carrier can be directly removed to expose the bottom of the chip and the connection pads, the method is simple, cost-saving, time-saving and provides the chip with better thermal-performance.

18 Claims, 5 Drawing Sheets

METHOD OF MAKING SEMICONDUCTOR CHIP PACKAGE

BACKGROUND OF THE INVENTION

1. Field of the Invention

This invention relates to methods of making a semiconductor chip package, and more specifically to methods of making a low-pin-count chip package by a film carrier.

2. Description of the Related Art

FIG. 1 is a low-pin-count chip package 100 according to a preferred embodiment disclosed in R. O. C. Publication No. 348306 entitled "Device Having Resin Package And Method Of Producing The Same". The low-pin-count chip package 100 includes a chip 110 sealed in a package body 120. The active surface of the chip 110 is provided with a plurality of bonding pads 110a electrically connected to a plurality of connection pads 130. The backside surface of the chip 110 is exposed from the package body 120 through a conductive adhesive layer 112. The connection pads 130 are located around the chip 110 and exposed from the lower surface of the package body 120 for making external electrical connection. The chip package 100 can be mounted onto a substrate, such as a printed circuit board, like other leadless devices.

R. O. C. Publication No. 348306 also discloses a method of producing the low-pin-count chip package 100. The method mainly utilizes a metallic frame 170 (as shown in FIG. 2) to produce a plurality of the chip packages 100 simultaneously. The method includes: (A) forming a photoresist layer over the metallic frame 170, transferring the desired pattern, and developing in a manner that areas on the metallic frame 170 corresponding to the connection pads 130 are not covered by the photoresist layer. (B) Electroplating areas on the metallic frame 170 which are not covered by the photoresist layer with a layer of metal such as gold or platinum thereby forming the plurality of connection pads 130. (C) Removing the photoresist layer. (D) Securely attaching the backside surface of the chip 110 to the metallic frame 170 through an adhesive layer. (E) Electrically coupling the bonding pads of the chip 110 to the corresponding connection pads 130. (F) Forming a package body over the chip 110. Finally, a separation process is taken to remove the metallic frame 170. As shown in FIG. 2, the separation process typically is done by utilizing an etching agent to selectively dissolve the metallic frame 170, with the connection pads 180 undissolved.

The method of making the low-pin-count chip package 100 described above utilizes the metallic frame 170 to support the chip 110 during the assembly process, and then the metallic frame 170 needs to be removed by etching agent. Therefore, the method is quite complicated, expensive and time-consuming.

SUMMARY OF THE INVENTION

It is a primary object of the present invention to provide a method of making a semiconductor chip package which utilizes a film carrier to support a semiconductor chip for making a low-pin-count chip package.

It is another object of the present invention to provide a method of making a semiconductor chip package utilizing a film carrier to support a semiconductor chip to make the chip package wherein the film carrier is directly removed eventually; hence, the method becomes simplified, cost-saving and time-saving.

It is still another object of the present invention to provide a method of making a semiconductor chip package wherein the bottom of the chip and the connection pads is exposed from the semiconductor chip package thereby enhancing the thermal performance of the chip.

A method of making a low-pin-count chip package according to a first embodiment of the present invention comprises the steps of: (A) providing a film carrier; (B) forming a plurality of through-holes in the film carrier; (C) laminating a metal layer on the film carrier; (D) etching the metal layer to form a die pad and a plurality of connection pads around the die pad, wherein the connection pads are disposed corresponding to the through-holes; (E) forming a metal coating on the surfaces of the die pad and the connection pads which are not covered by the film carrier; (F) attaching a semiconductor chip to the die pad, the semiconductor chip having a plurality of bonding pads; (G) electrically coupling the bonding pads of the semiconductor chip to the connection pads; (H) forming a package body over the film carrier, the die pad, the connection pads and the semiconductor chip; and (I) removing the film carrier to expose the lower surface of the die pad and the connection pads.

Another method of making a low-pin-count chip package according to a second embodiment of the present invention comprises the steps of: (A) providing a film carrier having a die receiving area; (B) forming a plurality of through-holes in the film carrier; (C) laminating a metal layer on the film carrier; (D) etching the metal layer to form a plurality of connection pads disposed corresponding to the through-holes; (E) forming a metal coating on the surfaces of the connection pads which are not covered by the film carrier; (F) attaching a semiconductor chip to the die receiving area of the film carrier by an adhesive layer, the semiconductor chip having a plurality of bonding pads; (G) electrically coupling the bonding pads of the semiconductor chip to the connection pads; (H) forming a package body over the film carrier, the connection pads and the semiconductor chip; and (I) removing the film carrier to expose the adhesive layer on the backside surface of the chip and the lower surface of the connection pads.

Since the method of making a chip package in accordance with the present invention utilizes a film carrier to support a semiconductor chip during the assembly process and the film carrier can be directly removed eventually, the method becomes simplified, cost-saving and time-saving. Since the film carrier is removed eventually, the film carrier may be made of cheaper material such as resin film, rather than expensive material like polyimide having properties that allow it to pass reliability tests, thereby effectively reducing the manufacturing cost. Besides, the die pad is exposed from the semiconductor chip package after the removal of the film carrier such that the heat-dissipating efficiency is enhanced.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 10:
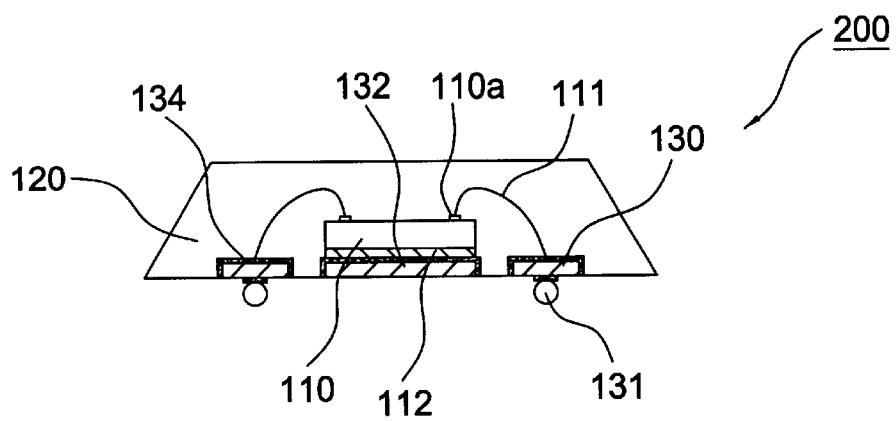
FIG. 10 is a cross-sectional view of a low-pin-count chip package in accordance with the present invention.

FIG. 10 discloses a low-pin-count chip package 200 formed in accordance with the present invention comprising a chip 110 sealed in a package body 120. The active surface of the chip 110 is provided with a plurality of bonding pads 110a electrically connected to a plurality of connection pads 130. The backside surface of the chip 110 is attached to a die pad 132 by a conductive adhesive layer 112, e.g. silver paste. The connection pads 130 are located around the chip 110 and exposed from the lower surface of the package body 120. The chip package 200 can be mounted onto a substrate, such as a printed circuit board (PC board), like other leadless devices. For example, a PC board is screen printed with a solder paste in a pattern which corresponds to the pattern of the connection pads 130 exposed from the bottom surface of the package 200. The package 200 is then appropriately positioned on the PC board and the solder is reflowed. It should be understood that the connection pads 130 exposed from the bottom surface of the package 200 can be printed with solder paste 131 and then mounted onto a substrate.

FIGS. 3–9 show a method of making the low-pin-count chip package 200 according to a first embodiment of the present invention.

Figure 1:
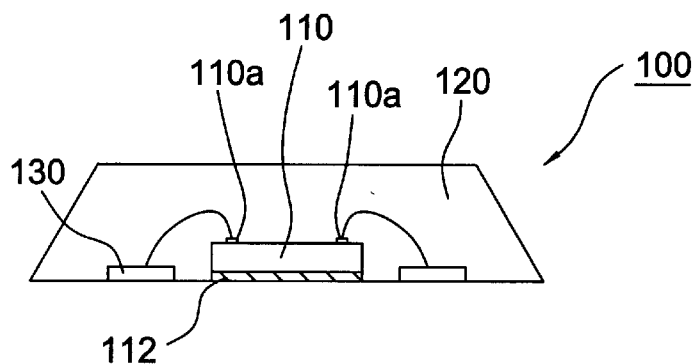
FIG. 1 is a cross-sectional view of a low-pin-count chip package according to a preferred embodiment disclosed in R. O. C. Publication No. 348306 entitled "Device Having Resin Package And Method Of Producing The Same"
Figure 2:
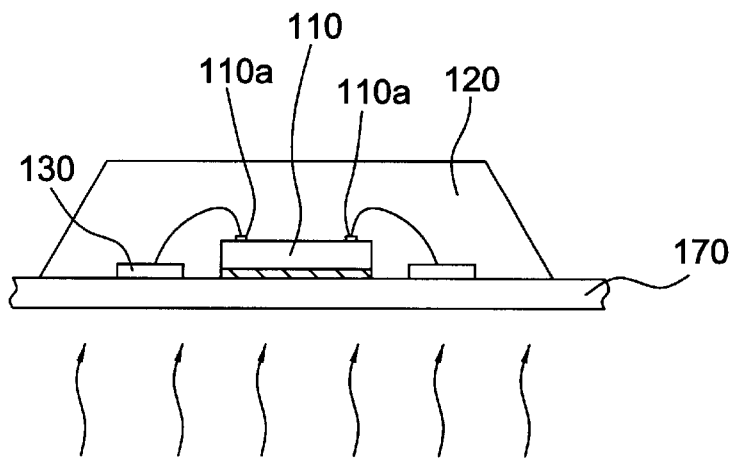
FIG. 2 is a cross-sectional view of a separation process in the method of producing the low-pin-count chip package of FIG. 1.
Figure 3:
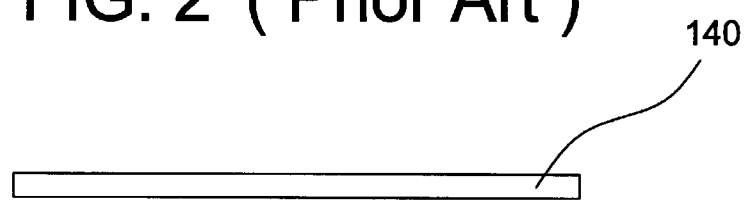
FIGS. 3–9 illustrate a method of making a low-pin-count chip package according to a first embodiment of the present invention.

FIG. 3 illustrates the film carrier 140 which may be a resin film. The purpose of the film carrier is used to support the semiconductor chip 110 during the assembly process for producing the low-pin-count chip package 200.

Figure 4:
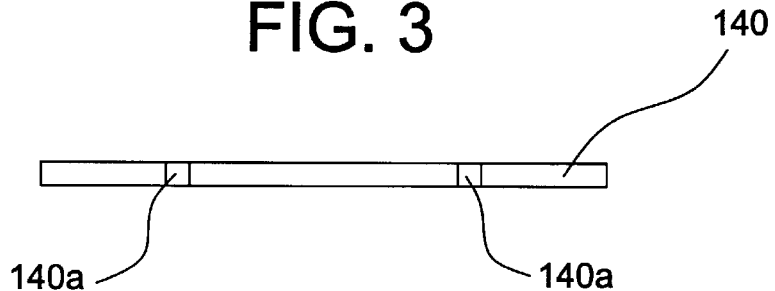

Referring to FIG. 4, a plurality of through-holes 140a are formed in the film carrier 140 by conventional punching technique. The locations of the through-holes 140a are corresponding to the connection pads 130 at the bottom of the chip package 200.

Figure 5:
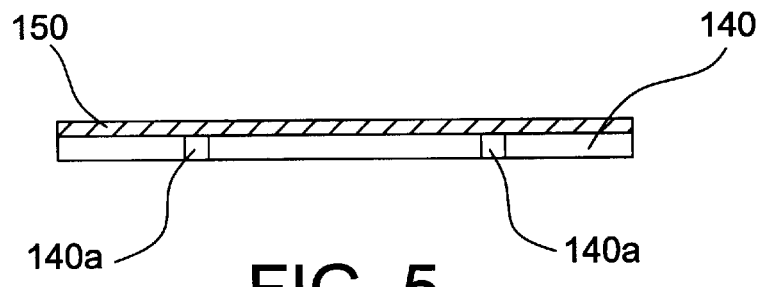

Referring to FIG. 5, the metal layer 150 such as copper foil is laminated on the film carrier 140 by conventional methods such as thermocompression.

Figure 6:
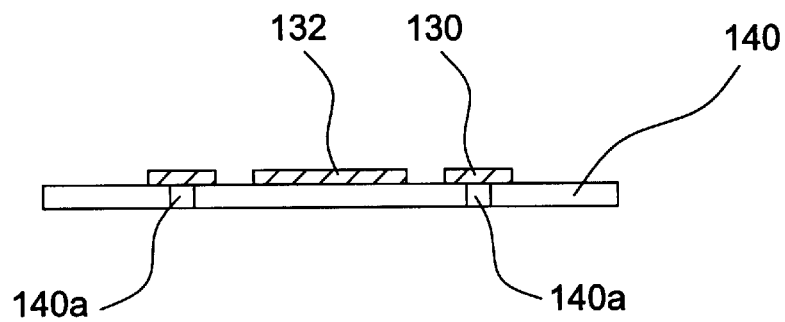

Referring to FIG. 6, the die pad 132 and the connection pads 130 are formed via photolithography and etching which comprise the steps of: (A) applying a photoresist layer on the surface of the metal layer 150; (B) pattern transferring by photolithography; (C) removing the unprotected portions of the metal layer 150 to form the corresponding die pad 132 and connection pads 130 by etching; and (D) removing the remaining photoresist layer.

Figure 7:
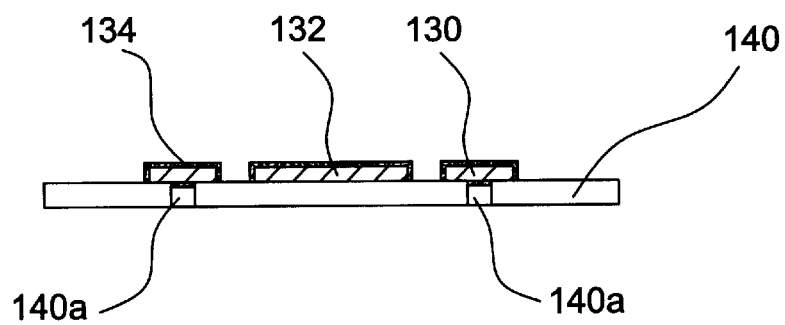

Referring to FIG. 7, the metal coating 134 is formed on the surfaces of the die pad 132 and the connection pads 130 which are not covered by the film carrier 140. The metal coating 134 can be plated on the surfaces of the die pad 132 and the connection pads 130 by using conventional techniques. For example, a layer of nickel is plated thereon and then a layer of gold is plated on the nickel layer. Since the metal coating 134 is also formed on the connection pads 130 adapted for electrical connecting to the chip 110, the metal coating 134 should be formed of materials that allow a good bond to the conventional bonding wire material.

Preferably, the surface of the metal coating 134 is further treated by electrochemical cathodization described in an article entitled "Adhesion enhancement of Pd plated leadframe" (ECTC 49th (electric components & technology conference) 1999, session 23 P5). The purpose of surface treatment by electrochemical cathodization is to improve adhesion between the metal coating 134 and the package body 120. Surface treatment of the metal coating 134 is done by electrochemical cathodization in a alkaline solution at room temperature.

Alternatively, the metal coating 134 may be applied with a cupric oxide coating (not shown) to improve adhesion between the metal coating 134 and the package body 120. Since the cupric oxide coating is electrically insulating, areas on the metal coating 134 adapted to form electrical interconnection (e.g., areas adapted for bonding with the bonding wires 111 or printing solder paste 131) are protected by tapes. Then, the metal coating 134 with protective tapes is electrolyzed as the anode in an alkaline solution, thereby forming a cupric oxide coating on the surface of the metal coating 134 except for the surface protected by tapes. It should be understood that the metal coating 134 can be previously electroplated with a layer of cupric oxide coating, and then the cupric oxide coating formed thereon can be removed from the areas on the metal coating 134 which are undesirable to be formed with a cupric oxide coating (e.g., areas adapted for bonding with the bonding wires 111 or printing solder paste 131) by mechanical abrasion or chemical etching.

Figure 8:
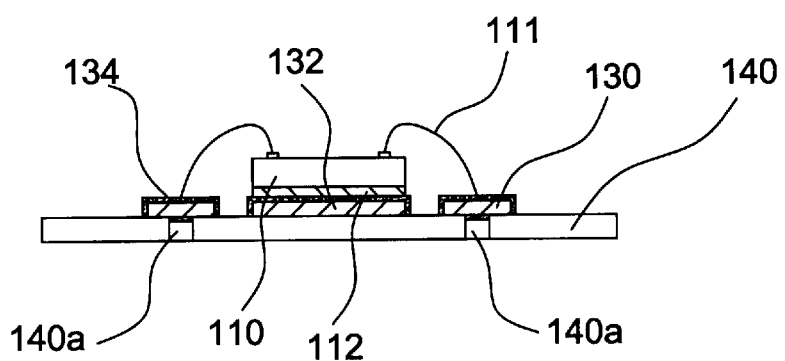

Referring to FIG. 8, the backside surface of the semiconductor chip 110 is securely attached to the upper surface of the die pad 132 through a electrically conductive adhesive layer 112. The bonding wires 111 are connected to the bonding pads 110a on the chip 110 and the connection pads 130 using known wire bonding techniques.

Figure 9:
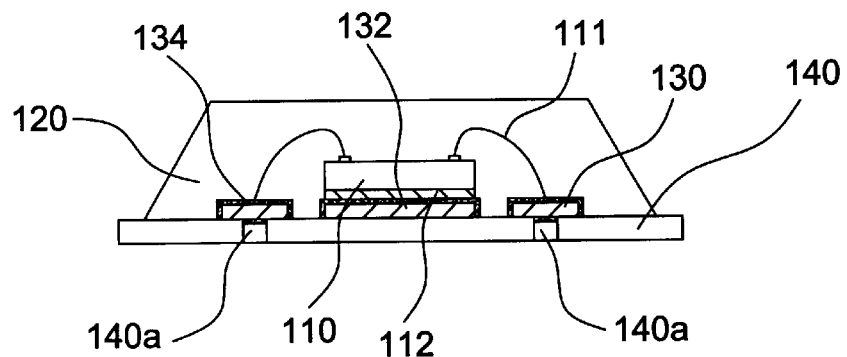

Referring to FIG. 9, the package body 120 is formed over the film carrier 140, the die pad 132, the connection pads 130 and the semiconductor chip 110 using known plastic molding methods such as transfer molding. Then, the film carrier 140 is removed to expose the lower surfaces of the die pad 132 and the connection pads 130. Since the adhesive force between the film carrier 140 and the die pad 132 or the connection pads 130 is less than the adhesive force between the package body 120 and the surface coating layer of the die pad 132 or the connection pads 130, the film carrier 140 can be easily taken away.

Finally, the connection pads 130 exposed at the bottom of the chip package can be printed with solder paste 131 to obtain the low-pin-count chip package 200 as shown in FIG. 10.

Figure 15:
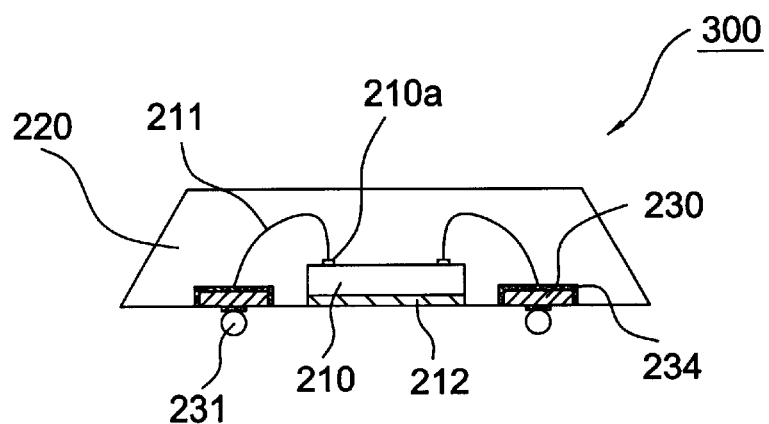
FIG. 15 is a cross-sectional view of another low-pin-count chip package in accordance with the present invention.

FIG. 15 discloses another low-pin-count chip package 300 formed in accordance with the present invention comprising a chip 210 sealed in a package body 220. The active surface of the chip 210 is provided with a plurality of bonding pads 210a electrically connected to a plurality of connection pads 230. The adhesive layer 212 on the backside surface of the chip 210 is exposed from the bottom of the package body 220. The connection pads 230 are located around the chip 210 and exposed from the lower surface of the package body 220. The connection pads 230 have a metal coating 234 formed thereon. The chip package 300 can be mounted onto a substrate, such as a printed circuit board (PC board), like other leadless devices. Preferably, the connection pads 230 exposed from the bottom surface of the package 300 can be printed with solder paste 231 and then mounted onto a substrate.

FIGS. 11–15 show a method of making the low-pin-count chip package 300 according to a second embodiment of the present invention.

Figure 11:
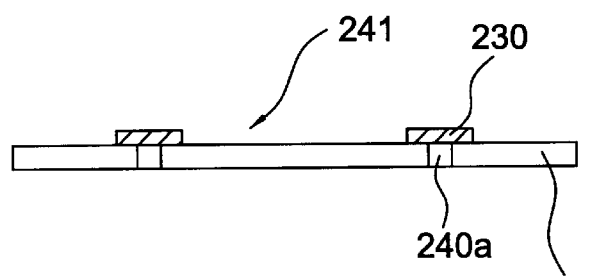
FIGS. 11–14 illustrate another method of making a low-pin-count chip package according to a second embodiment of the present invention.

Referring to FIG. 11, a plurality of through-holes 140a are formed in the film carrier 240 by conventional punching technique. The film carrier 240 has a die receiving area 241 centrally located therein. The through-holes 240a are disposed around the die receiving area 241. The connection pads 230 are formed from a metal layer such as copper foil by photolithography and etching. The metal layer is laminated on the film carrier 240 by conventional methods such as thermocompression.

Figure 12:
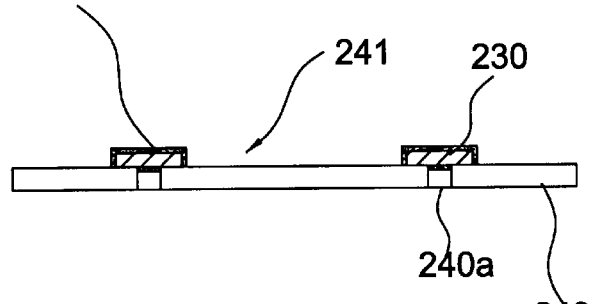

Referring to FIG. 12, the metal coating 234 is plated on the surfaces of the connection pads 230 which are not covered by the film carrier 240 by using conventional techniques. The metal coating 234 can be formed on the surfaces of the connection pads 230 by using conventional plating techniques. For example, a layer of nickel is plated thereon and then a layer of gold is plated on the nickel layer. Since the metal coating 234 is also formed on the connection pads 230 adapted for electrical connecting to the chip 210, the metal coating 234 should be formed of materials that allow a good bond to the conventional bonding wire material.

Figure 13:
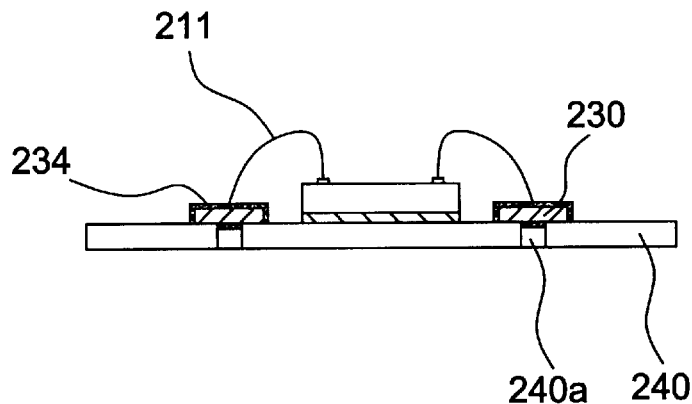

Referring to FIG. 13, the backside surface of the semiconductor chip 210 is securely attached to the die receiving area 241 of the film carrier 241 through an adhesive layer 212. The purpose of the film carrier 241 is to support the chip 210 during the assembly process and to maintain the chip 210 in a proper position relative to the connection pads 230. The bonding wires 211 are connected to the bonding pads 210a on the chip 210 and the connection pads 230 using known wire bonding techniques. Preferably, the adhesive layer 212 is preferably made of thermosetting material such as epoxies, silicones or polyamides. Since the thermoplastic material typically melts at 100° C. and the wire bonding typically occurs at 250° C., the adhesive layer 212 made of thermoplastic material may be softened during the wire bonding process such that the chip 210 can't be maintained in a proper position thereby causing bonding problems.

Figure 14:
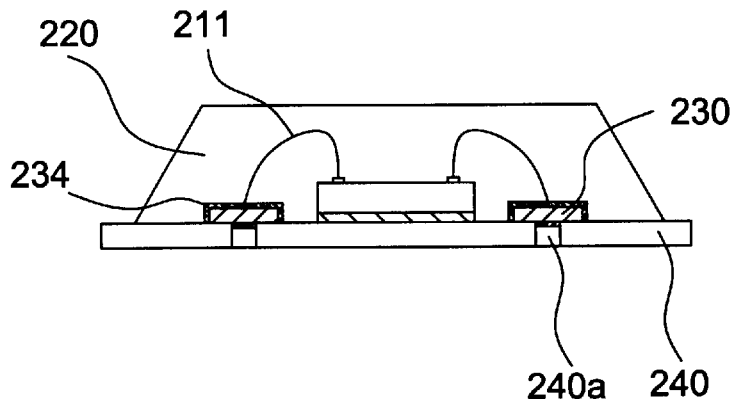

Referring to FIG. 14, the package body 220 is formed over the film carrier 240, the connection pads 230 and the semiconductor chip 210 using known plastic molding methods such as transfer molding. Then, the film carrier 240 is removed to expose the adhesive layer 212 on the backside surface of the chip 210 and the lower surfaces of the connection pads 230. Since the adhesive force between the film carrier 240 and the connection pads 230 is less than the adhesive force between the package body 220 and the surface coating layer of the connection pads 230, the film carrier 240 can be easily taken away.

Finally, the connection pads 230 exposed at the bottom of the chip package can be printed with solder paste 231 to obtain the low-pin-count chip package 300 as shown in FIG. 15.

Figure 17:
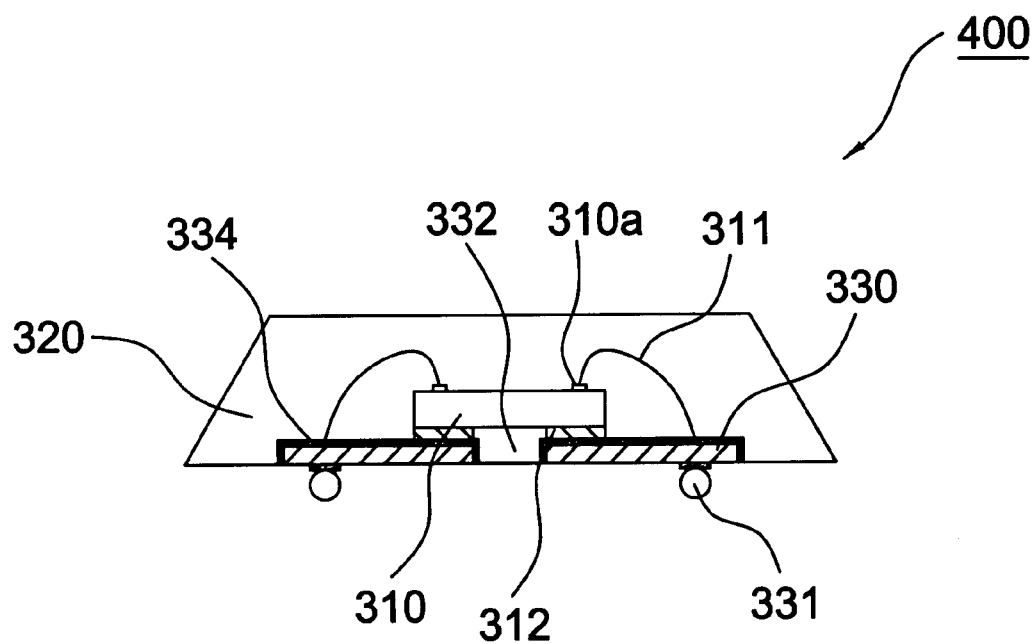
FIG. 17 is a cross-sectional view of a further low-pin-count chip package in accordance with the present invention.

FIG. 17 discloses a further low-pin-count chip package 400 formed in accordance with the present invention comprising a chip 310 sealed in a package body 320. The chip 310 is electrically connected to outer ends of a plurality of connection pads 330. The backside surface of the chip 310 is attached to inner ends of the connection pads 330 by an adhesive layer 312. The outer end of each connection pad 130 has a portion exposed from the lower surface of the package body 320. The connection pads 330 have a metal coating 334 formed thereon. The chip package 400 can be mounted onto a substrate, such as a printed circuit board (PC board), like other leadless devices. Preferably, the connection pads 330 exposed from the bottom surface of the package 300 can be printed with solder paste 331 and then mounted onto a substrate.

Figure 16:
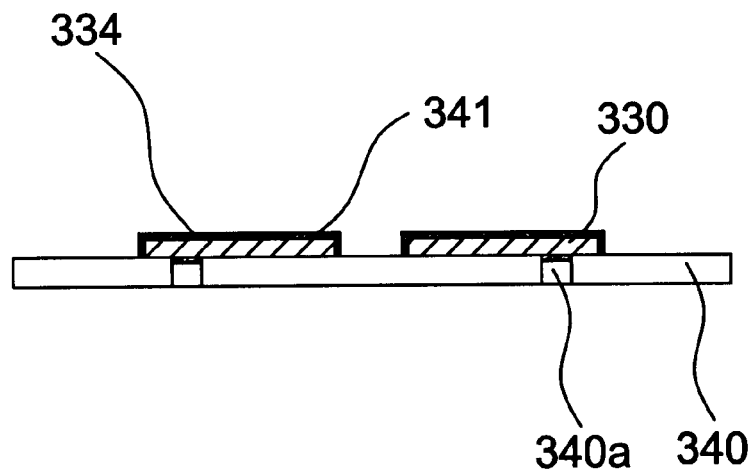
FIG. 16 illustrates a further method of making a low-pin-count chip package according to a third embodiment of the present invention.

FIG. 16 is used to illustrate a method of making the low-pin-count chip package 400 according to a third embodiment of the present invention. As shown in FIG. 16, a plurality of through-holes 340a are formed in the film carrier 340 by conventional punching technique. The connection pads 330 are formed from a metal layer such as copper foil by photolithography and etching. The metal layer is laminated on the film carrier 340 by conventional methods such as thermocompression. The inner ends of the connection pads 330 define a die receiving area for carrying the chip 310. The remaining manufacturing steps are the same as those described above.

The method of making a low-pin-count chip package in accordance with the present invention utilizes a film carrier to support a semiconductor chip during the assembly process. Since the adhesive force between the film carrier and the die pad or the connection pads is less than the adhesive force between the package body and the surface coating layer of the die pad or the connection pads, the film carrier 140 can be easily removed without damaging the die pad or the connection pads; therefore, the manufacturing method of the present invention is simplified, cost-saving and time-saving.

Although the invention has been explained in relation to its preferred embodiment, it is to be understood that many other possible modifications and variations can be made without departing from the spirit and scope of the invention as hereinafter claimed.

What is claimed is:

1. A method of making a semiconductor chip package comprising the steps of:

providing a film carrier;

forming a plurality of through-holes in the film carrier;

laminating a metal layer on the film carrier;

etching the metal layer to form a die pad and a plurality of connection pads around the die pad, wherein the connection pads are disposed corresponding to the through-holes;

forming a metal coating on the surfaces of the die pad and the connection pads which are not covered by the film carrier;

attaching a semiconductor chip to the die pad, the semiconductor chip having a plurality of bonding pads;

electrically coupling the bonding pads of the semiconductor chip to the connection pads;

forming a package body over the film carrier, the die pad, the connection pads and the semiconductor chip; and removing the film carrier.

2. The method as claimed in claim 1, further comprising the step of printing solder paste on the connection pads exposed from the bottom of the package body.

3. The method as claimed in claim 1, wherein the metal layer is a copper foil.

4. The method as claimed in claim 1, wherein the metal coating comprises a layer of nickel covering the surfaces of the die pad and the connection pads which are not covered by the film carrier, and a layer of gold covering the nickel layer.

5. The method as claimed in claim 4, further comprising the step of treating the surface of the metal coating by electrochemical cathodization.

6. The method as claimed in claim 4, further comprising the step of forming a cupric oxide coating on the metal coating in a manner that the areas on the metal coating adapted for electrical interconnecting are not covered by the cupric oxide coating.

7. The method as claimed in claim 1, further comprising the step of treating the surface of the metal coating by electrochemical cathodization.

8. The method as claimed in claim 1, further comprising the step of forming a cupric oxide coating on the metal coating in a manner that the areas on the metal coating adapted for electrical interconnecting are not covered by the cupric oxide coating.

9. The method as claimed in claim 1, wherein the film carrier comprises a resin film.

10. A method of making a semiconductor chip package comprising the steps of:

provrding a film carrier having a die receiving area;

forming a plurality of through-holes in the film carrier;

laminating a metal layer on the film carrier;

etching the metal layer to form a plurality of connection pads disposed corresponding to the through-holes;

forming a metal coating on the surfaces of the connection pads which are not covered by the film carrier;

attaching a semiconductor chip to the die receiving area of the film carrier, the semiconductor chip having a plurality of bonding pads;

electrically coupling the bonding pads of the semiconductor chip to the connection pads;

forming a package body over the film carrier, the connection pads and the semiconductor chip; and removing the film carrier.

11. The method as claimed in claim 10, further comprising the step of printing solder paste on the connection pads exposed from the bottom of the package body.

12. The method as claimed in claim 10, wherein the metal layer is a copper foil.

13. The method as claimed in claim 10, wherein the metal coating comprises a layer of nickel covering the surfaces of the connection pads which are not covered by the film carrier, and a layer of gold covering the nickel layer.

14. The method as claimed in claim 13, further comprising the step of treating the surface the metal coating by electrochemical cathodization.

15. The method as claimed in claim 13, further comprising the step of forming a cupric oxide coating on the metal coating in a manner that the areas on the metal coating adapted for electrical interconnecting are not covered by the cupric oxide coating.

16. The method as claimed in claim 10, further comprising the step of treating the surface of the metal coating by electrochemical cathodization.

17. The method as claimed in claim 10, further comprising the step of forming a cupric oxide coating on the metal coating in a manner that the areas on the metal coating adapted for electrical interconnecting are not covered by the cupric oxide coating.

18. The method as claimed in claim 10, wherein the film carrier comprises a resin film.

* * * * *